United States Patent [19]

Hack et al.

[11] Patent Number: 4,547,621
[45] Date of Patent: Oct. 15, 1985

[54] STABLE PHOTOVOLTAIC DEVICES AND METHOD OF PRODUCING SAME

[75] Inventors: Michael Hack, Troy; Subhendu Guha, Clawson, both of Mich.

[73] Assignee: Sovonics Solar Systems, Solin, Ohio

[21] Appl. No.: 623,860

[22] Filed: Jun. 25, 1984

[51] Int. Cl.⁴ .............................................. H01L 31/06
[52] U.S. Cl. .............................. 136/249 TJ; 136/255; 136/258; 357/30; 29/572; 427/74
[58] Field of Search .......... 136/249 TJ, 255, 258 AM; 357/30; 29/572; 427/74

[56] References Cited

U.S. PATENT DOCUMENTS

| | | | |
|---|---|---|---|
| 4,206,002 | 6/1980 | Sabnis et al. | 136/249 TJ |
| 4,377,723 | 3/1983 | Dalal | 136/249 TJ |
| 4,379,943 | 4/1983 | Yang et al. | 136/249 TJ |
| 4,471,155 | 9/1984 | Mohr et al. | 136/258 |

FOREIGN PATENT DOCUMENTS

| | | | |
|---|---|---|---|
| 56-88377 | 7/1981 | Japan | 136/258 AM |
| 58-98988 | 6/1983 | Japan | 136/255 |
| 2083701 | 3/1982 | United Kingdom | 136/258 AM |

*Primary Examiner*—Aaron Weisstuch
*Attorney, Agent, or Firm*—Marvin S. Siskind; Ronald W. Citkowski

[57] ABSTRACT

An improved photovoltaic device characterized by long term stability in its photoconversion ability. The device is adapted to absorb incident light throughout a substantial portion of the bulk of the photoactive region thereof in a substantially uniform manner. Said uniform absorption of light is provided by grading the band gap of at least a portion of the semiconductor material of the photoactive region thereof such that the graded portions most proximate the light incident surface of the photovoltaic device have a wider band gap than do those portions more distal from the light incident surface. The band gap gradation may be smooth or stepped, and may be accomplished by compositional variation of the semiconductor materials forming the photoactive region. A method for fabricating the stable photovoltaic device of the instant invention is also provided.

10 Claims, 4 Drawing Figures

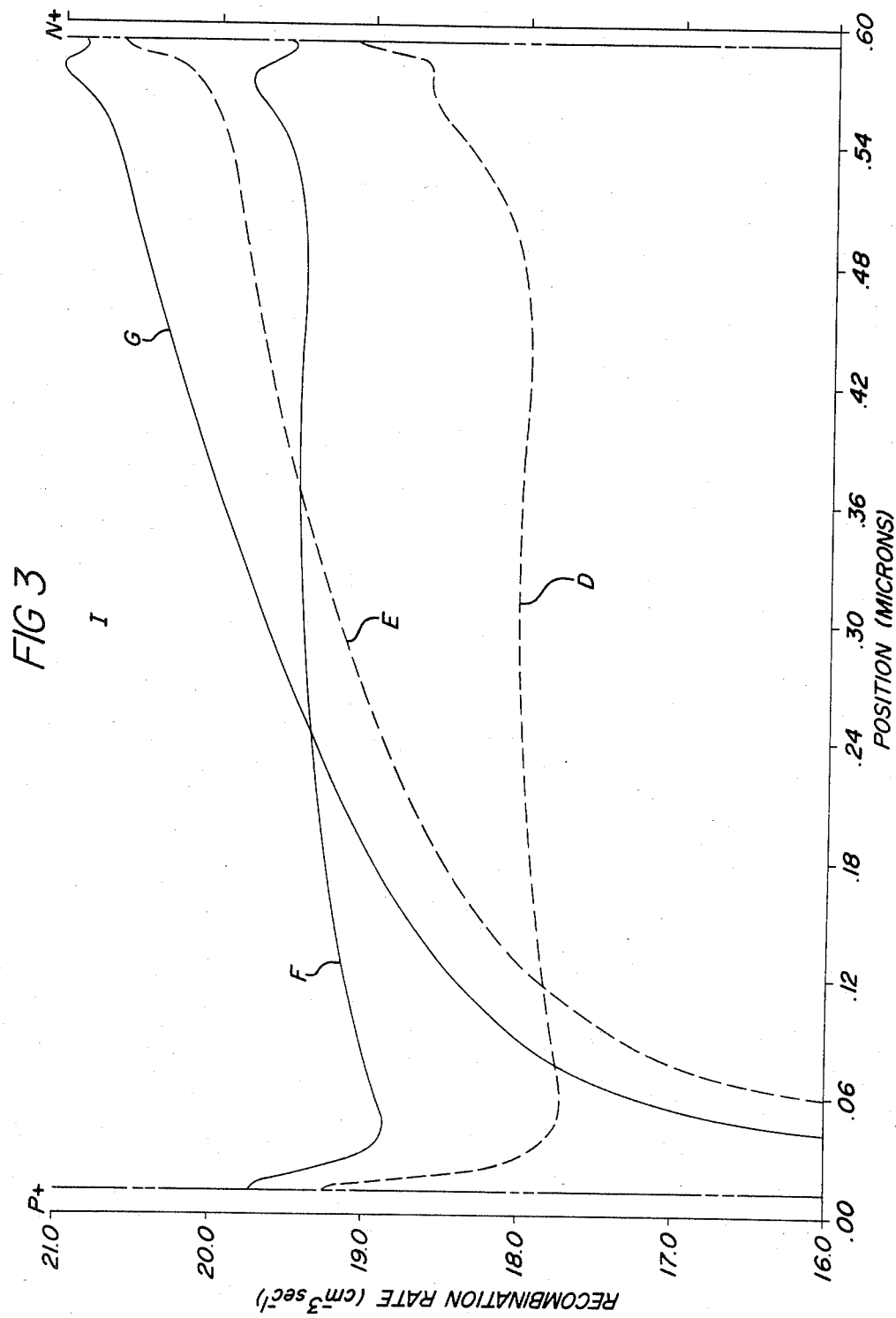

STABLE PHOTOVOLTAIC DEVICES AND METHOD OF PRODUCING SAME

FIELD OF THE INVENTION

This invention relates generally to photovoltaic devices, and more particularly to thin film photovoltaic devices which (1) include a body of semiconductor material adapted to provide a photoactive region for generating charge carrier pairs in response to photons of incident light, and (2) are characterized by long term photogenerative stability under a variety of operating conditions. The principles of the instant invention are particularly well adapted for the fabrication of p-i-n type photovoltaic devices which include, as their photoactive element, at least one layer of amorphous semiconductor alloy material containing silicon and/or germanium.

BACKGROUND OF THE INVENTION

According to the principles of the instant invention, there are disclosed photovoltaic devices and method for the fabrication of photovoltaic devices which exhibit a substantially uniform absorption of photons from the solar spectrum (typically Global AM 1.5 illumination), and consequently a uniform distribution of charge carriers throughout at least a substantial portion of the bulk of the photoactive region thereof. As a result, the peak rate of charge carrier (defined as electron-hole pair) recombination is reduced and the photovoltaic devices are rendered less sensitive to the effects of light induced defects formed therein. Long term photoconversion stability is thereby improved.

Recently, considerable efforts have been made to develop systems for depositing amorphous semiconductor materials, each of which can encompass relatively large areas, and which can be doped to form p-type and n-type materials for the production of p-i-n type photovoltaic devices which are, in operation, substantially equivalent to their crystalline counterparts. It is to be noted that the term "amorphous", as used herein, includes all materials or alloys which have no long range order, although they may have short or intermediate range order or even contain, at times, crystalline inclusions.

It is now possible to prepare amorphous silicon alloys by glow discharge or vacuum deposition techniques, said alloys possessing (1) acceptable concentrations of localized defect states in the energy gaps thereof, and (2) high quality electrical and optical properties. Such deposition techniques are fully described in U.S. Pat. No. 4,226,898, entitled Amorphous Semiconductors Equivalent To Crystalline Semiconductors, issued to Stanford R. Ovshinsky and Arun Madan on Oct. 7, 1980; U.S. Pat. No. 4,217,374, of Stanford R. Ovshinsky and Masatsugu Izu, which issued on Aug. 12, 1980, also entitled Amorphous Semiconductors Equivalent To Crystalline Semiconductors; and U.S. Pat. No. 4,517,223 of Stanford R. Ovshinsky, David D. Allred, Lee Walter, and Stephen J. Hudgens entitled Method Of Making Amorphous Semiconductor Alloys And Devices Using Microwave Energy, which issued on May 14, 1985. As disclosed in these patents, which are assigned to the assignee of the instant invention and the disclosures of which are incorporated by reference, fluorine introduced into the amorphous silicon semiconductor layers operates to substantially reduce the density of the localized defect states therein and facilitates the addition of other alloying materials, such as germanium.

The concept of utilizing multiple cells, to enhance photovoltaic device efficiency, was described at least as early as 1955 by E. D. Jackson in U.S. Pat. No. 2,949,498 issued Aug. 16, 1960. The multiple cell structures therein disclosed utilized p-n junction crystalline semiconductor devices. Essentially, the concept employed different band gap devices to more efficiently collect various portions of the solar spectrum and to increase open circuit voltage (Voc). The tandem cell device (by definition) has two or more cells with the light directed serially through each cell. In the first cell a large band gap material absorbs only the short wavelength light, while in subsequent cells smaller band gap materials absorb the longer wavelengths of light which pass through the first cell. By substantially matching the generated currents from each cell, the overall open circuit voltage is the sum of the open circuit voltage of each cell, while the short circuit current thereof remains substantially constant. However, it is virtually impossible to match crystalline lattice constants as is required in the multiple cell structures of the prior art. Therefore, tandem cell structures cannot be practically fabricated from crystalline materials in a manner which would have commercial production ramifications. As the assignee of the instant invention has shown, however, such tandem cell structures are not only possible, but can be economically fabricated in large areas by employing amorphous materials.

The multiple cells preferably include a back reflector for increasing the percentage of incident light reflected from the substrate back through the semiconductor layers of the cells. It should be obvious that the use of a back reflector, by increasing the use of light entering the cell, increases the operational efficiency of the multiple cells. Accordingly, it is important that any photoresponsive layer of semiconductor material deposited atop the light incident surface of the substrate be transparent so as to pass a high percentage of incident light from the reflective surface of the back reflector through the layers of semiconductor material.

Unlike crystalline silicon which is limited to batch processing for the manufacture of solar cells, amorphous silicon alloys can be deposited in multiple layers over large area substrates to form solar cells in a high volume, continuous processing system. Such continuous processing systems are disclosed in the following U.S. Pat. No. 4,400,409, for A Method Of Making P-Doped Silicon Films And Devices Made Therefrom; U.S. Pat. No. 4,410,588, for Continuous Amorphous Solar Cell Production System; U.S. Pat. No. 4,438,723, for Multiple Chamber Deposition And Isolation System And Method; U.S. Pat. No. 4,492,181 for Method and Apparatus For Continuously Producing Tandem Amorphous Photovoltaic Cells; and U.S. Pat. No. 4,485,125 for Method and Apparatus For Continuously Producing Tandem Amorphous Photovoltaic Cells; and pending U.S. patent application Ser. No. 244,386 filed Mar. 16, 1981 for continuous Systems For Depositing Amorphous Semiconductor Material. As disclosed in these patents and application, a substrate may be continuously advanced through a succession of deposition chambers, wherein each chamber is dedicated to the deposition of a specific semiconductor material. In making a photovoltaic device of p-i-n type configurations, the first chamber is dedicated for depositing a p-type semiconductor alloy, the second chamber is dedicated for depositing an intrinsic amorphous semiconductor alloy, and the third chamber is dedicated for depositing an n-type semiconductor alloy. Since each deposited semiconductor alloy, and especially the intrinsic semiconductor alloy, must be of high purity; every possible precaution is taken to insure that the sanctity of the vacuum envelope formed by the various chambers of the deposition apparatus remains uncontaminated by impurities, regardless of origin.

The layers of semiconductor alloy material thus deposited in the vacuum envelope of the deposition apparatus may be utilized to form photoresponsive devices, such as, but not limited to photovoltaic cells which include one or more p-i-n cells or one or more n-i-p cells, Schottky barriers, photodiodes, phototransistors, or the like. Additionally, by making multiple passes through the succession of deposition chambers, or by providing an additional array of deposition chambers, multiple stacked cells of various configurations may be obtained.

As should be apparent by the foregoing, thin film amorphous semiconductor materials offer several distinct advantage over crystalline materials, insofar as they can be easily and economically fabricated into large area photoresponsive devices by newly developed mass production processes. However, heretofore produced amorphous silicon based semiconductor materials were prone to degrade as a result of prolonged exposure to light. This process, termed "photodegradation", or "Staebler-Wronski degradation," although not fully understood, is believed to be due to the fact that long-term exposure to a photon flux tends to break the bonds between the constituent atoms of the semiconductor material, thereby resulting in the formation of defect states in the band gap, such as dangling bonds, which are detrimental to the photovoltaic efficiency of a photoresponsive device which incorporates the degraded semiconductor material. It has further been observed that photogenerated defects may be annealed out of a sample of degraded semiconductor material by exposing said sample to elevated temperatures; for example, temperatures of approximately 150° degrees for several hours. Samples of semiconductor material, thus degraded by operational exposure to light and subsequently annealed, are restored to approximately the same level of photovoltaic performance which they exhibited prior to said operational degradation.

It is somewhat parodoxical that the higher the initial (pre-operational) quality of the photovoltaic semiconductor material, (1) the greater the effect of photodegradation thereupon, and (2) the greater the operation-dependent loss of efficiency exhibited by a photovoltaic device incorporating such higher quality semiconductor materials. The reason for this phenomenon is that lower quality photovoltaic semiconductor material initially includes a relatively high number of defect states therein and consequently, the formation of additional defect states in the energy gap thereof via photodegradation is not as significant as for a higher quality semiconductor material which is initially characterized by a relatively low number of defect states. Because of the fact that the assignee of the instant invention is now able to commercially manufacture high quality photovoltaic semiconductor materials exhibiting a low initial density of defect states, in a high volume, continuous production process, the problem of photodegradation of photovoltaic devices fabricated therefrom has become increasingly significant. The practical ramifications of the foregoing is that the consumer is not interested in expending large sums of money on photovoltaic energy generating systems which will lose upwards of 20% efficiency over their operating life.

Heretofore, the effects of photodegradation were dealt with by either (1) annealing the semiconductor material to remove the defect states and restore its electrical generating capacity, or (2) ignoring the defect states and allowing the semiconductor material to operate at less than full efficiency. Neither of the aforementioned options is commercially acceptable. While annealing does restore photodegraded cells to their initial operating efficiency, it necessitates the inclusion of additional hardware in a photovoltaic power system at additional cost to the consumer, and might also entail the periodic expenditure of labor. Several methods of annealing have been proposed. In one such method the annealing procedure may be instituted on a cyclic basis wherein the semiconductor material is periodically, typically at an interval of months to years, heated to an elevated temperature for a period of time sufficient to remove the defect states therein and restore the initial efficiency thereof. The heating may be carried out in situ by including a heat source in the photovoltaic installation, or the semiconductor material may be removed from the point of use and heated in an oven. In an alternative process, the semiconductor material may be continuously annealed by incorporating said material into a solar collector panel, which panel is adapted to collect and retain the solar thermal energy incident thereupon. In such an arrangement the semiconductor material is maintained, during normal operation, at the elevated annealing temperature and the formation of defect states as well as the annealing of those defect states, occurs simultaneously. Depending upon the operating temperature of the semiconductor material, overall degradation can be prevented or substantially slowed down. Such methods and techniques of continuous annealing are disclosed in U.S. patent application Ser. No. 636,172 of Vincent D. Cannella entitled, "Photovoltaic Panel Having Enhanced Conversion Efficiency Stability", filed July 31, 1984 and assigned to the assignee of the instant invention, the disclosure of which application is incorporated herein by reference.

As mentioned supra, in the second alternative, the amorphous photovoltaic devices which incorporate the semiconductor material are simply allowed to photodegrade. The rate of photodegradation for a particular device configuration may be readily ascertained, and the power requirement for a given installation may be therefore readily specified to account for the degree of photodegradation expected during the operational life of the photovoltaic devices. For example, it may be predicted that a particular photovoltaic device will degrade to 80% of its initial electrical performance within a period of 10 years of operation; therefore a built-in excess capacity of 20% may be incorporated in the initial installation to account for this subsequent loss. While such an approach is relatively simple and may be acceptable for a variety of photovoltaic installations, it is obviously a less than adequate solution to the problem, and represents an intolerable solution for many other uses. In installations in which space for solar collection is at a premium, it is clearly desirable to have the photovoltaic devices operate at their maximum capacity at all times. In other installations reliability and consistency of electrical power generated by and delivered from the devices is required. In such installations, the photovoltaic devices must be fabricated from semiconductor material which is relatively consistent in its conversion efficiency throughout the expected operational lifetime thereof.

As should be appreciated from the foregoing discussion, it would be highly advantageous and commerically necessary to provide a thin film amorphous photovoltaic device fabricated from semiconductor material which does not require the inclusion of extraneous hardware therewith, but which is nonetheless capable of maintaining a consistently high conversion efficiency under long term, high photon flux operating conditions, i.e., does not markedly degrade when exposed to light.

As previously stated, the mechanism of photodegradation of amorphous photovoltaic semiconductor materials is not fully understood; however, it is believed that said photodegradation involves the production of a wide distribution of defect states in the band gap of the semiconductor material. The term "defects", or "defect states" as generally used by routineers in the field of amorphous semiconductor materials, is a broad term generally including all deviant atomic configurations such as: broken bonds, dangling bonds, bent bonds, strained bonds, vacancies, microvoids, etc. In a photovoltaic device, a charge carrier pair (i.e. an electron and a hole) is generated in response to the absorption of photons from incident radiation in the photoactive region of the semiconductor material thereof. Under the influence of an internal electrical field established by the doped layers of semiconductor material of the photovoltaic device, such as a solar cell, the charge carriers are drawn toward opposite electrodes of the cell causing the positively charged holes to collect at the positive electrode and the negatively charged electrons to collect at the negative electrode thereof. Under ideal operating conditions, every photogenerated charge carrier will be conducted to its respective collection electrode. However, operating conditions are not ideal and the loss of charge carriers occurs to some degree in all photovoltaic cells. The primary charge carrier collection loss is due to charge carrier recombination, wherein an electron and a hole reunite. Obviously, charge carriers that reunite or recombine are not available for electrode collection and the resultant production of electrical current. Defects or defect states that occur in the photoactive region of the semiconductor material of the photovoltaic device provide recombination centers which facilitate the reunion and recombination of electrons and holes. Therefore, the more defects or defect states that are present in the semiconductor material of a device, the higher the rate of charge carrier recombination therein. Accordingly, charge carrier collection efficiency decreases as the rate of charge carrier recombination increases within the photoactive region of a given semiconductor material; an increase in the number of defect states is therefore, at least partially responsible for an increase in the rate of charge carrier recombination and a concomanitant decrease in photovoltaic cell conversion efficiency.

In photovoltaic cells of the type which comprise a layer of intrinsic amorphous semiconductor material having a layer of p-type semiconductor material disposed on one side thereof and a layer of n-type semiconductor material disposed on the other side thereof, referred to hereinafter as p-i-n type photovoltaic cells, applicants have observed a dramatic decrease in blue response (conversion of photons from the blue portion of the solar spectrum into electrical current) in the photoactive regions of the semiconductor material thereof relative to the red response (conversion of photons from the red portion of the solar spectrum into electrical current) in the photoactive regions of the semiconductor material thereof, upon photodegradation. That is to say, when such photovoltaic cells are exposed to a high intensity photon flux, the photoconversion efficiency measured under blue illumination decreases much more than the photoconversion efficiency measured under red illumination. The terms "blue illumination" or "blue light" are defined herein as having a wavelength within the approximate range of 350 to 550 nanometers; and the terms "red illumination" or "red light" are defined herein as photons having a wavelength within the approximate range of 550 to 750 nanometers. It is known that the absorption coefficient (the rate at which photons absorbed as they generate electron-hole pairs) of blue light in amorphous silicon alloy materials is greater than the absorption coefficient of red light in amorphous silicon alloy materials; therefore, under illumination equivalent to standard terrestrial conditions blue light is almost totally absorbed in the first thousand angstroms of the photoactive region of the semiconductor material of the photovoltaic cell, whereas the absorption of red light occurs more uniformly throughout the bulk of said photoactive region. Therefore, under blue illumination a very high density of charge carriers is generated in the first thousand angstroms of the photoactive region of the cell. In an undegraded photovoltaic cell, few defect states are present to provide recombination sites, and consequently the charge carriers are efficiently collected by the respective electrodes of the cell despite the high density thereof. However, if the photovoltaic cell is photodegraded, the high density of defect states therepresent provides recombination centers which facilitate the recombination of electrons and holes. Furthermore, the high density of electrons and holes created under blue illumination is conducive to, and greatly facilitates said recombination, since statistically, an electron and a hole are more likely to be reunited at a recombination center under high density conditions. Therefore, the collection efficiency of charge carriers, and the resultant overall cell performance under blue illumination is correspondingly decreased.

Photons of red illumination passing through the semiconductor material of a photovoltaic cell are not as readily absorbed as are photons of blue illumination. Consequently, said red photons penetrate a further distance through the bulk of the photoactive region of the semiconductor material of the photovoltaic cell. Charge carriers generated by the absorption of photons from illumination by the red portion of the solar spectrum, being more uniformly dispersed throughout the bulk of the photoactive region of the semiconductor material, are concentrated at a lesser density than are the charge carriers generated by the absorption of photons from illumination of blue portions of the solar spectrum. While the total number charge carriers generated in the semiconductor material of the photovoltaic cell under steady state conditions may be substantially equal if equal fluxes of red or blue photons enter and are absorbed by the semiconductor material of the cell, the peak rate of charge carrier recombination under red illumination is lower, since charge carriers generated by red illumination are more uniformly dispersed throughout the bulk of the semiconductor material, and are, therefore, less likely to encounter a charge carrier of opposite polarity at a recombination center than are charge carriers generated by blue illumination. In summary: the effective lifetime of charge carriers is dependent upon the wavelength of the illumination creating them. The lifetime is minimum where recombination is maximum, and this point of maximum recombination will depend upon the absorption profile of light in the photoactive region of the semiconductor material of a photovoltaic device.

Based upon the observations enumerated hereinabove, applicants conclude that it is necessary to promote the more uniform absorption of all photons of light from the solar spectrum throughout the bulk of the photoactive region of the semiconductor material, especially the absorption of photons of blue light. In this manner, more uniform generation of charge carriers throughout the bulk of the photoactive region of the semiconductor material is promoted. High charge carrier density in a narrow portion of the photoactive region is thus prevented, and the rate of charge carriers recombination at defect sites is decreased. The result is the fabrication of a photovoltaic cell exhibiting increased operational tolerance to defect states and hence improved stability (which translates into increased photogenerative efficiency).

It is well known that when a beam of light passes through a homogeneous absorbing medium, the intensity of that beam of light decreases exponentially with the absorption thereof throughout the medium, the greatest absorption occuring most proximate the light incident surface of the medium. According to the principles of the instant invention, there is provided a photovoltaic device exhibiting uniform absorption of light throughout the photoactive region of the semiconductor material thereof. As used herein, the term "uniform absorption of light" will refer to an absorption of light that deviates from the aforementioned exponential pattern. For example, the decrease in light intensity as said light travels through the absorbing medium may be linear, that is to say, at a hypothetical point half way through the bulk of the absorbing medium, a beam of light will have half the intensity of said beam of light at the light incident surface of the absorbing medium. Of course, the term "uniform absorption of light" is not meant to be solely limited to light absorption which follows such a linear relationship, but, rather, is meant to include all light absorption patterns that deviate from the normal exponential attenuation of light through a homogeneously absorbing medium. It is the essence of the instant invention to promote the uniform absorption by forming those regions of the absorbing medium most proximate the light incident surface thereof more transparent to incident radiation than those portions of the absorbing medium more distal from said light incident surface. Techniques for, and photovoltaic structures produced by, promoting the uniform absorption of light throughout the photoactive region of the semiconductor material of a photovoltaic cell will be described in greater detail hereinbelow.

More particularly, the instant invention provides for the uniform absorption of light throughout at least a substantial portion of the bulk of the photoactive region of the semiconductor material of a photovoltaic device by grading the band gap of the intrinsic layer of that device. A graded band gap intrinsic layer is one in which the band gap of the semiconductor material from which that layer is fabricated varies spatially; i.e., the band gap of the intrinsic semiconductor material taken in planes parallel to the plane of the intrinsic layer will vary relative to the thickness of that intrinsic layer. According to the principles set forth herein, the band gap of the intrinsic layer is graded so as to provide a relatively wide band gap region (for instance 1.9 eV) proximate the light incident surface of the photoactive region of the semiconductor material of the photovoltaic device and a narrower band gap region (for instance 1.7 eV) in the path of travel of the beam of incident light from the light incident surface. It should be noted that the term "graded band gap", as used herein, is intended to include any change in the band gap of the semiconductor material relative to the thickness thereof and specifically includes (1) a smooth variation in the band gap, be it a linear or nonlinear change, (2) a stepped variation in the band gap wherein said band gap varies in a series of two or more discrete steps, as well as (3) any combination of smooth and stepped band gap gradations. By grading the band gap of the intrinsic layer of semiconductor material of a p-i-n-type photovoltaic device, absorption of incident light, especially the more easily absorbed blue light, is spaced throughout at least a substantial portion of the bulk of the photoactive region thereof and the effective lifetime of charge carriers resulting from the absorption of photons from that illumination is increased. The result is the fabrication of an improved photovoltaic device exhibiting increased tolerance to defect states in the band gap thereof. It should be noted that it is not necessary to grade the band gap of the entire layer of intrinsic semiconductor material in order to promote said uniform photon absorption throughout substantially all of the bulk of the photoactive region. This is because the strongest photon absorption in amorphous silicon or amorphous silicon:germanium alloy layers occurs in a relatively narrow (i.e. 1000-2000 angstrom) portion of those layers; accordingly, by rendering this portion of the photoactive semiconductor layer relatively more transparent to incident radiation the uniform absorption of photons, as hereinabove defined, is promoted.

As mentioned supra, in the preferred embodiment band gap grading is accomplished by compositionally varying the intrinsic semiconductor material. For example, a band gap broadening element may be added to at least the portion of the photoactive intrinsic semiconductor material most proximate the light incident surface of the photovoltaic device to render those portions least absorbtive of incident radiation. Alternatively, the layer of intrinsic semiconductor material may be initially formed of a relatively wide band gap semiconductor material and a band gap narrowing element added to those portions of the photoactive region of that intrinsic layer most distal from the light incident surface of said photovoltaic device. By controlling the concentration of the band gap modifying element added to any given portion of the intrinsic layer, the width of the band gap thereof may be controlled. By smoothly varying the concentration of the band gap modifying element in the intrinsic semiconductor material, a smoothly graded band gap may be achieved. Similarly, by varying the concentration of the band gap modifying element in the previously described stepped manner, a stepped gradation of the band gap of the intrinsic semiconductor material may be achieved. Such techniques of band gap grading (also referred to as "profiling") will be described in greater detail hereinbelow.

A photovoltaic device having a varying band gap in a relatively narrow portion of the photoactive region of the layer of intrinsic semiconductor material is disclosed in a paper entitled, Achievement Of Higher Efficiency Amorphous Silicon-Germanium Solar Cells Using Affinity Gradients, presented by S. Wiedeman and E. A. Fagen at the 17th Annual I.E.E.E. Photovoltaic Specialists Conference held May 1–4, 1984 in Kissimmee, Fla. Disclosed therein is a n-i-p-type photovoltaic device formed of an amorphous silicon-germanium alloy in which the composition of the intrinsic semiconductor layer was profiled over the first few hundred angstroms from the light incident surface thereof. This band gap variation was accomplished by gradually altering the ratio of silicon to germanium in those few hundred angstroms. The object of such band gap variation is to establish an electrical field of varying strength adjacent the light incident surface of the intrinsic semiconductor material, which field is adapted to eliminate charge carrier losses at the interface of the n doped and intrinsic layer interface due to back diffusion of those charge carriers across the n and intrinsic interface. The authors of the paper believed that, because of the electrical field, a 29% improvement in the initial conversion efficiency of the photovoltaic devices was achieved. It should be noted that no claim was implicitedly or explicitely presented by the authors of the aforementioned paper for the improved long term stability of photovoltaic devices thus fabricated. This may be due to the fact that it is not possible to achieve improved long term stability from the reported structure since, as described hereinabove, losses in conversion efficiency are due to the bulk recombination of charge carriers at defect sites rather than a surface phenemonon such as back diffusion at semiconductor material layer interfaces. The method described by Wiedeman, et al has, as its object, the elimination of the back diffusion of charge carriers across the n doped and intrinsic layer interface, and, accordingly, compositional variation of the intrinsic semiconductor material is restricted to the immediate vicinity of that interface. By limiting the profile of the intrinsic semiconductor layers to, at best, the first few hundred angstroms, the majority of blue light would still be absorbed adjacent the light incident surface of that layer. Therefore, the method disclosed by Wiedeman, et al is not intended to and does not have any effect upon the recombination of charge carriers throughout the bulk of at least a portion of the intrinsic semiconductor material due to the presence of defect sites, such as those caused by photogradation.

As should be apparent from the foregoing discussion, there exists a definite need for an amorphous thin film photovoltaic device which (1) exhibits long term stability in the conversion efficiency thereof, (2) does not require annealing to achieve that stability, and (3) does not necessitate the inclusion of extraneous hardware to maintain that stability. The instant invention provides such an amorphous thin film photovoltaic device in which the absorption of light in at least a substantial portion of the photoactive region of the semiconductor material thereof is substantially uniform. The photovoltaic device of the instant invention is tolerant of photoinduced or photogenerated defects formed during operation and exhibits long term stability in its photoconversion efficiency.

These and many other advantages of the instant invention will be apparent from the drawings, the detailed description of the invention and the claims which follow.

BRIEF DESCRIPTION OF THE INVENTION

There is disclosed herein a photovoltaic device of the type comprising a body of semiconductor material having a first electrode in electrical communication with a first surface thereof, said electrode forming the light incident surface of the device, and a second electrode in electrical communication with a second surface of the semiconductor body. In one embodiment, the semiconductor body includes at least one triad of layers of semiconductor material, each triad comprising a layer of intrinsic semiconductor material having a layer of p-type semiconductor material disposed in contact with a first surface thereof and a layer of n-type semiconductor material disposed in contact with a second surface thereof. The layers of intrinsic semiconductor material of each at least one triad are adapted to provide a photoactive region for absorbing photons from incident light and generating charge carrier pairs in response thereto. The improvement in the photovoltaic device of the instant invention relates to the fabrication of the intrinsic semiconductor material in a manner which promotes the substantially uniform absorption of photons of incident light throughout at least a substantial portion of the bulk of the photoactive region of at least one of the triads of layers, so as to generate electron-hole pairs throughout said substantial portion of the bulk and reduce charge carrier recombination in the intrinsic semiconductor material, thereby providing a photovoltaic device which exhibits long term stability. The uniform absorption of light may be provided by grading the band gap throughout at least a portion of the bulk of the layer of intrinsic semiconductor material such that the portion of said intrinsic layer having the widest band gap is most proximate the light incident surface of the photovoltaic device. The band gap may be graded by varying the composition of the intrinsic layer of semiconductor material with respect to the distance from the light incident surface of that intrinsic layer. This is accomplished through the addition of band gap broadening elements such as nitrogen, oxygen, carbon, and mixtures thereof. In another preferred embodiment of the invention, wherein tandem photovoltaic cells are fabricated, the band gap of the intrinsic semiconductor material is graded by the addition of band gap narrowing elements such as germanium, tin, lead, and mixtures thereof. The principles of the instant invention are not limited to p-i-n-type cells, but, rather, are readily applicable to other types of photoresponsive devices, such as p-n devices.

According to the method of the instant invention, tandem photovoltaic devices comprising several triads of layers of improved semiconductor material may be fabricated. The intrinsic layer of semiconductor material of one or more of triads is fabricated with a graded band gap so as to provide for uniform absorption of incident light throughout at least a significant portion of the bulk of the photoactive region of the semiconductor material so as to fabricate a high efficiency photovoltaic device exhibiting long term stability.

BRIEF DESCRIPTION OF THE DRAWINGS

FIG. 3 is a graph in which the recombination rate for holes (or electrons) generated by the absorption of blue and red illumination in the intrinsic semiconductor layer of both a photodegraded and a non-photodegraded p-i-n photovoltaic device is plotted as a function of position within said device.

DETAILED DESCRIPTION OF THE DRAWINGS

I. The Photovoltaic Device

Figure 1:
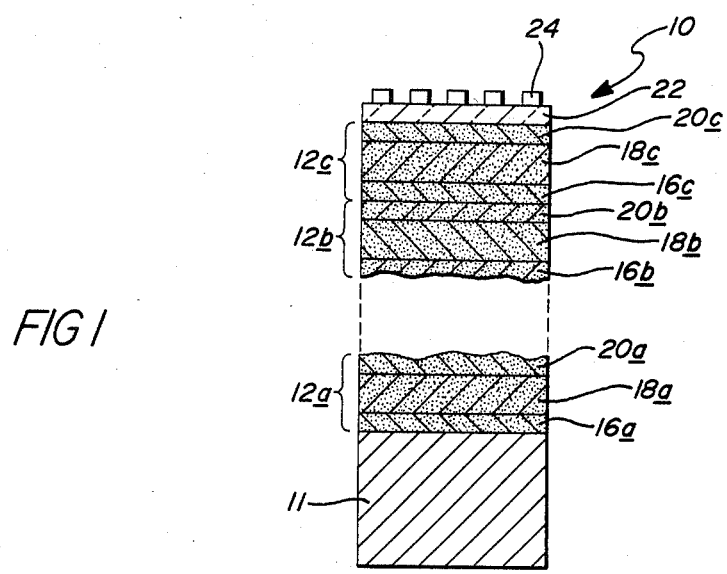
FIG. 1 is a fragmentary, cross-sectional view of a tandem photovoltaic device, formed of a plurality of successive p-i-n layers, and including the graded band gap layer of intrinsic semiconductor material of the instant invention.

Referring now to the drawings and particularly to FIG. 1, a photovoltaic cell formed of a plurality of successive p-i-n layers, each of which includes a semiconductor alloy, is shown generally by the reference numeral 10. The cell 10 includes the graded band gap intrinsic layer of the instant invention, and thus is representative of the type of photoresponsive device in which the instant invention may be advantageously employed.

More particularly, FIG. 1 shows a p-i-n type photovoltaic device such as a solar cell 10 made up of individual p-i-n type cells 12a, 12b, and 12c. Below the lowermost cell 12a is a substrate 11 which also functions as the bottom electrode of the cell 10. The substrate 11 may be formed of a metallic material such as thin stainless steel or aluminum, or it may be formed from a thin electroformed member such as nickel. Alternatively, the substrate 11 may be formed from an insulating material such as glass or synthetic polymers, with an electrically conductive electrode layer formed thereupon. Although certain applications may require a thin oxide layer and/or a series of base contacts and/or a reflecting layer prior to the deposition of the semiconductor material, for purposes of this application, the term, "substrate" shall include any elements added thereto by preliminary processing.

Each of the cells, 12a, 12b, and 12c is fabricated with an amorphous semiconductor body containing at least a silicon or germanium alloy. Each of the semiconductor bodies includes an n-type conductivity semiconductor layer 20a, 20b, and 20c; a graded band gap intrinsic semiconductor layer 18a, 18b, and 18c; and a p-type conductivity semiconductor layer 16a, 16b, and 16c. As illustrated, cell 12b is an intermediate cell and, as indicated in FIG. 1, additional intermediate cells may be stacked atop the illustrated cells without departing from the spirit or scope of the present invention.

It is to be understood that following the deposition of the layers of semiconductor material, a further deposition process may be either performed in a separate environment or as a part of a continuous process. In this step, a TCO (transparent conductive oxide) layer 22, formed in the preferred embodiment of indium tin oxide, also referred to herein as the top or upper electrode, is deposited atop the uppermostlayer of semiconductor material. An electrode grid 24 may be applied to the device where the cell is of a sufficiently large area, or if the conductivity of the TCO layer 22 is insufficient. The grid 24 shortens the charge carrier path through the TCO and thus increases the collection efficiency.

While the photovoltaic cell illustrated in FIG. 1 is a stacked assembly of p-i-n cells, it should be apparent that the instant invention may also be employed with other cell arangements such as single p-i-n cells, or stacked or single n-i-p or p-n cells.

II. The Device As Modified By The Instant Invention

It has been previously stated that the recombination of charge carriers is a major factor in determining the losses in the conversion efficiency of photovoltaic devices. In p-i-n-type photovoltaic cells it has been found that the recombination of charge carriers near the n-i layer interface (i.e. the light incident surface of the intrinsic semiconductor layer) is controlled by hole lifetime, since holes definitely represent minority charge carriers in this region. Based upon laboratory observation and computer simulations of p-i-n photovoltaic devices, it has been determined that effective hole lifetime depends upon the wavelength of incident radiation which is responsible for the generation of that hole. Further, illumination from the red portion of incident radiation is responsible for the generation of holes characterized by longer effective lifetimes than the effective lifetime of holes generated by the blue portion of incident radiation. It should be noted that strictly speaking, carrier lifetime is an inherent bulk property of the particular semiconductor material from which the photovoltaic device is fabricated. However, since the semiconductor material is extremely thin, bulk properties are not manifested; that is to say, the device structure itself modifies the inherent properties of the bulk material. Hence, it is more correct to speak of "effective carrier lifetimes" when discussing charge carriers in a photovoltaic cell. Herein, the terms "carrier lifetime" and "effective carrier lifetime" are used interchangably with respect to electrons and holes.

Figure 2:
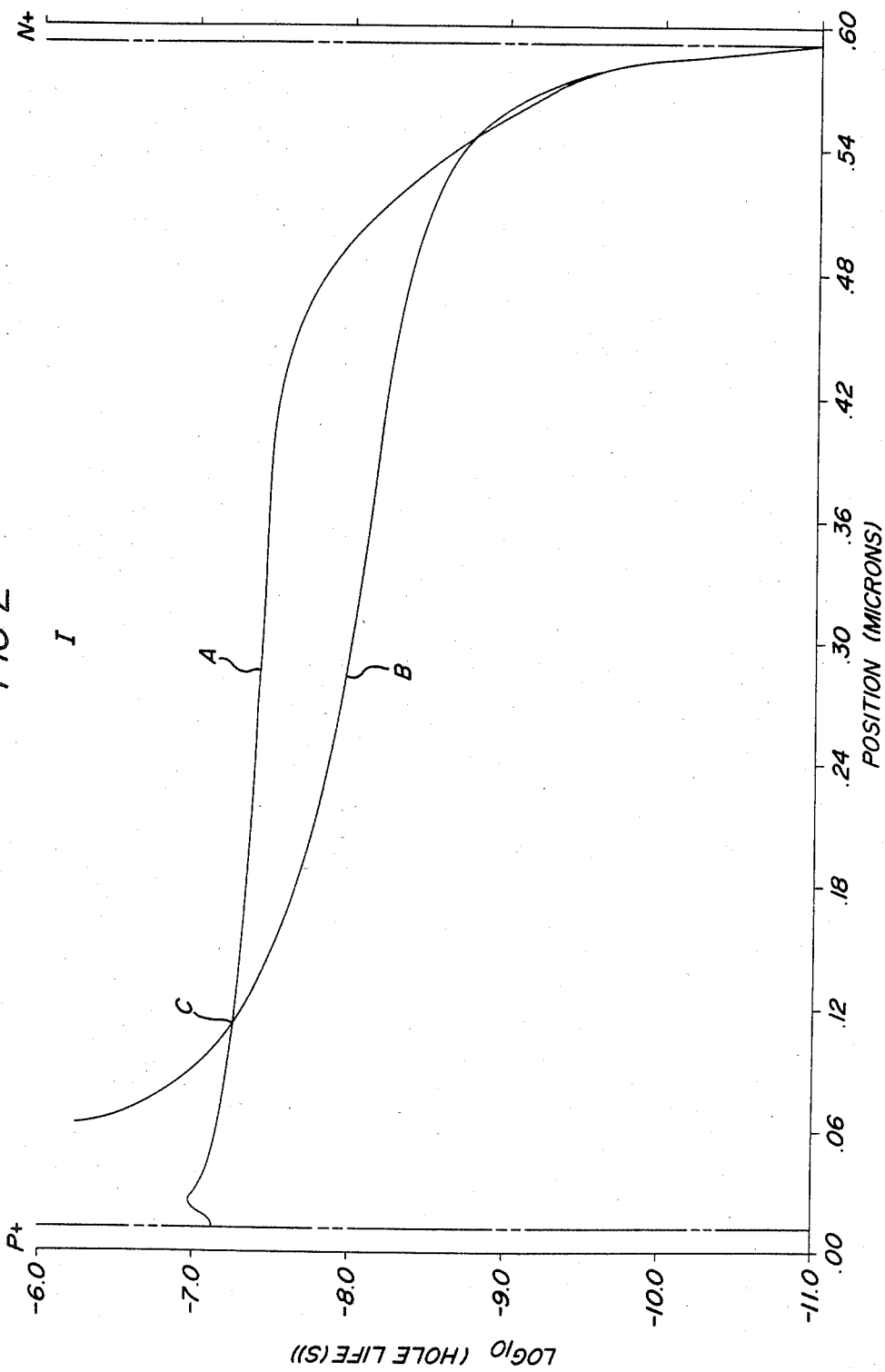
FIG. 2 is a graph in which the lifetime of holes generated by the absorption of blue and red illumination in the intrinsic semiconductor layer of a p-i-n photovoltaic device is plotted as a function of position within said device.

FIG. 2 is a graphic representation of hole (or electron) lifetime in the intrinsic semiconductor layer of a p-i-n-type photovoltaic device at various positions in that intrinsic layer (the position being taken relative to the light incident surface) said holes being generated by both red illumination (Curve A) and blue illumination (Curve B). FIG. 2 was derived from a computer simulation of a p-i-n photovoltaic device illuminated through the n layer with a flux of $10^{16}$ photons per $cm^2$. Plotted along the abscissa is the position, in microns within the intrinsic semiconductor layer of the photovoltaic cell; the ordinate shows the $Log_{10}$ of hole lifetime as measured in seconds. The intrinsic layer of amorphous silicon alloy material was determined to possess an absorption coefficient of $2 \times 10^3$ $cm^{-1}$ with respect to red light (see Curve A). Curve B similarly depicts the lifetime of holes generated by the absorption of blue radiation in the intrinsic layer of amorphous silicon alloy material. Said material was determined to possess an absorption coefficient of $2 \times 10^5$ $cm^{-1}$ for blue light.

It is thus seen that the coefficient for the absorption of blue radiation in the amorphous silicon alloy material is two orders of magnitude greater than that of the red radiation in the same material. The conclusion to be drawn is that blue radiation is more strongly absorbed by the amorphous silicon alloy material of a photovoltaic cell than is a similar intensity of red radiation. For this reason, most of the blue absorption will occur proximate (i.e. within 1000 angstoms) of the n-i interface, (the light incident interface), while the red absorption will be more uniformly distributed throughout the bulk of the layer of intrinsic semiconductor material. As a result of this differential light absorption in the intrinsic material, there is a differential distribution of holes generated by the absorption of the photons of light. It is this differential distribution of holes generated by incident radiation which is responsible for the variation in the lifetime of holes generated from the absorption of red, vis-a-vis, blue illumination.

The graph of FIG. 2 clearly illustrates that the lifetime of holes generated by the absorption of photons of red light (Curve A) is generally greater, and more uniform (throughout the bulk of the intrinsic material of the device), than the absorption of photons of blue light (Curve B). As was explained in detail in the Background section of this application, hole lifetime is dependent upon the density of charge carriers, and the density of charge carriers is in turn dependent upon the absorption characteristics of the particular semiconductor material employed. Obviously, if the absorption chacteristics of blue light of the layer of intrinsic semiconductor material could more closely approximate those absorption characteristics of red light, the lifetimes of holes generated by said blue light would then approximate the lifetimes of holes generated by said red light. Further, by matching the lifetimes of blue and red generated holes, under operating conditions the blue response of the photovoltaic cell would approximate the red response of the cell, which would result in a lower loss in efficiency upon photodegradation. That is to say, the absorption characteristics of the photovoltaic device would be changed to thereby change the effective lifetime for blue and red generated charge carriers. Finally, note that at point C, curve B crosses Curve A, thus indicating that the lifetime of holes generated by blue light is greater in that region of the semiconductor material of the p-i-n device than the lifetime of holes generated by red light. This apparently anomalous result is of no major significance, since at this point in the layer of intrinsic semiconductor material holes are no longer the minority carriers, and therefore their effective lifetimes do not control device efficiency.

FIG. 3 is a graph representing the recombination rate for holes (or electrons), expressed in units of recombinations per cubic centimeter of semiconductor material per second at various positions taken in the sandwich direction of a p-i-n type photovoltaic device, for both a degraded and an undegraded semiconductor material, under both red and blue illumination. In this computer analysis, photodegradation of the semiconductor material was simulated by increasing both the minimum density of states and the charge carrier capture cross section of the recombination centers by an order of magnitude. More particularly, curve D, indicated by a dashed line, represents the hole recombination rate of the undegraded semiconductor material of a photovoltaic device under red illumination. Curve E, also indicated by a dashed line, represents the hole recombination rate of the same material under blue illumination. Curve F represents the hole recombination rate of the semiconductor material of a degraded device under red illumination, and Curve G represents the hole recombination rate of the same degraded material under blue illumination. As can be seen from even a cursory perusal of the figure, the lowest hole recombination rate is exhibited by the semiconductor material of an undegraded device under red illumination (see Curve D), which recombination rate is relatively uniform throughout the thickness of the semiconductor material of the intrinsic layer, neglecting variations due to interface defects which occur in the immediate proximity of the interfaces between the intrinsic and doped layers. Even after photodegradation, the rate of hole recombination under red illumination remains relatively uniform and relatively low (see Curve F). Translating this data into practical results, the indication is that the semiconductor material of the undegraded photovoltaic device under red illumination of approximately $10^{16}$ photons per square centimeter per second produced a short circuit current of approximately 0.9mA. Under the same conditions of illumination, the semiconductor material of the degraded photovoltaic device produced a short circuit current of 0.68mA. Thus, the unmistakable conclusion is that photodegradation produces approximately a 25% loss in current generated by the p-i-n photovoltaic device as measured under red illumination.

Curves E and G are indicative of the photogenerative blue response of the intrinsic semiconductor material of the same p-i-n photovoltaic device. From those curves it is noted that while the rate of hole recombination is relatively high in the undegraded device (Curve E), the rate of hole recombination is much higher after degradation (Curve G) of that semiconductor material. Therefore, the curves teach that the rate of recombination for blue generated charge carriers varies greatly throughout the bulk (in the sandwich direction) of the semiconductor material in the intrinsic layer, with the highest rate of hole recombination occuring in the first third of the intrinsic layer as measured from the n-intrinsic (i.e. light incident) interface thereof. This high hole recombination rate is reflected in the loss of efficiency exhibited upon photodegradation of the photovoltaic device. In specific numerical terms, it has been found that the undegraded photovoltaic device represented by Curve E generates a short circuit current of 1.14mA upon illumination with a flux of $10^{16}$ photons per centimeter squared, vis-a-vis, the photodegraded photovoltaic device which generates a short circuit current of only 0.11mA under the same conditions of illumination. This difference in photogenerated current represents a 90% loss in photoconversion efficiency which is directly attributable to photodegradation, when that efficiency is measured under blue illumination.

As should be apparent from the foregoing discussion of FIGS. 2 and 3, the loss in efficiency of the photovoltaic device upon photodegradation of the photoactive semiconductor material thereof is primarily due to the loss of blue response in that material; which loss is most severe in approximately the first thousand angstroms of the light incident side of the layer of intrinsic semiconductor material and is correlatable to the higher absorption of photons of blue light by the semiconductor material as compared to red illumination.

In contrast thereto, the instant invention provides a p-i-n-type photovoltaic device in which the absorption characteristics of the layer of intrinsic semiconductor material is tailored to provide a substantially uniform absorption of light therethrough, and especially a uniform absorption of blue light throughout a substantial portion of the bulk thickness thereof. A photovoltaic device, such as a solar cell, thus configured, will, even after degradation, exhibit an overall photoresponse (the photogeneration of electrical current) which approximates the photoresponse to incident red illumination, vis-a-vis, the photoresponse thereof to blue illumination. In this manner, the loss of efficiency of a photovoltaic device under blue light is minimized, thus allowing said photovoltaic device to operate at optimum efficiencies for prolonged periods of time without the necessity of annealing.

According to the principles of the instant invention, the uniform absorption of both blue and red photons of incident illumination in the photoactive region of the semiconductor material of a photovoltaic device is promoted by grading the band gap of the semiconductor material which forms the intrinsic layer of the photovoltaic device. In the graded band gap structure, portions of the photoactive region most proximate the light incident surface of the photovoltaic device are specifically tailored to be more transparent to incident illumination than are those more distal portions of the photoactive region thereof. In this manner, incident light is absorbed more deeply into the bulk thickness of the photoactive region of the device, thereby avoiding the formation of a high density of charge carriers proximate the light incident surface thereof. In other words, stability of the photovoltaic device is increased by distributing the charge carriers more uniformly throughout the bulk thickness of the photoactive region thereof.

Figure 4:
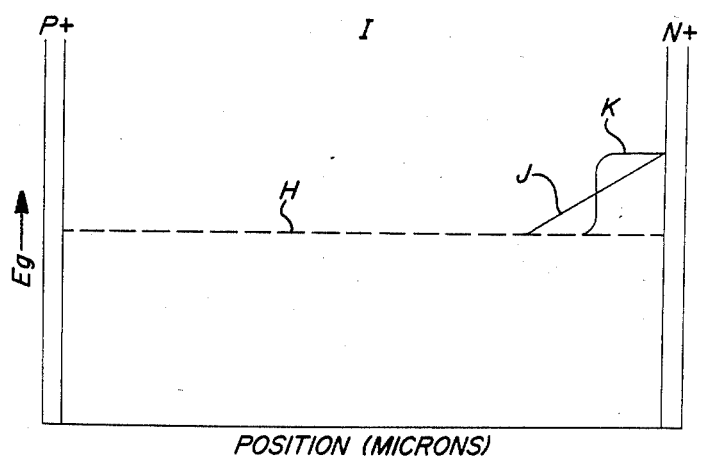
FIG. 4 is a graphic depiction of the band gap of the intrinsic semiconductor material of a p-i-n type photovoltaic device as a function of the thickness of that layer, and is indicative of several varying manners in which the band gap of the intrinsic layer may be graded in accordance with the principles of the instant invention.

FIG. 4 is a graphic representation of a p-i-n-type photovoltaic device, illustrating several variations in which the band gap of the intrinsic semiconductor material is graded. In prior art photovoltaic devices the band gap of the layer of intrinsic semiconductor material was constant, that is to say, the band gap of the layer did not vary with the thickness thereof. The energy of the band gap of such a uniformly graded layer of semiconductor material is represented by dashed line H, shown as extending horizontally from the n-doped layer, through the layer of intrinsic semiconductor material and into the p-doped layer. According to the principles of the instant invention, the band gap of the intrinsic layer of semiconductor material is graded either in a uniform or stepped fashion. Curve J is illustrative of a smoothly varying, graded band gap of intrinsic semiconductor material. Note that the band gap energy of the layer of intrinsic semiconductor material represented by Curve J, varies linearly from a highest initial value at the n-intrinsic layer interface to a lowest value represented by the line H, at a point approximately ⅓ of the way into the bulk thickness of that intrinsic layer of semiconductor material, as measured from the n-intrinsic (light incident) interface. In an alternative embodiment, not illustrated herein, the band gap energy may vary smoothly, in the manner illustrated by Curve J, but in a nonlinear manner; i.e., the variation in band gap energy with increasing thickness of the intrinsic semiconductor material may be exponential.

It is also possible to grade the band gap of the photoactive layer in a stepped manner, as illustrated by Curve K. In such a stepped gradation, the energy of the band gap varies through a plurality of levels or tiers, from an initially highest value at the light incident interface to progressively lower values as the distance from that interface increases. Although Curve K shows two levels of band gap energy (i.e. one step), the band gap energy may be varied through the use of as great a number of steps as deemed convenient. Curves J and K depict the band gap as graded through only a portion of the bulk thickness of the intrinsic semiconductor layer so as to emphasize the fact that the entire thickness of the intrinsic layer need not be band gap graded in order to promote the uniform absorption of photons of both red and blue light. It has been found that if the initial one to two thousand angstroms of the intrinsic layer of semiconductor material is band gap graded, uniform absorption will be promoted throughout a substantial portion of the bulk thickness of that intrinsic layer so as to secure the improved stability promised by the instant invention. Obviously, it would be within the scope of the instant invention to grade the band gap of the intrinsic layer of semiconductor material throughout a greater, or lesser portion of the bulk thickness thereof; the only proviso being that a substantially uniform absorption of incident radiation (as defined hereinabove) be promoted.

The photovoltaic devices fabricated according to the principles of the instant invention include a photovoltaic layer of semiconductor material manufactured by any process of thin film deposition known to those ordinarily skilled in the art, provided that the composition of the photoresponsive layer is profiled during the deposition thereof, so as to grade the band gap of that layer. Among the methods which may be employed, without limitation, are sputtering, evaporation, chemical vapor deposition, or glow discharge deposition.

It has been found that certain elements, including nitrogen, oxygen, fluorine, and carbon, whether taken alone or in combination, are capable of widening the band gap of amorphous silicon and germanium alloy materials. Accordingly, the improved, more stable photovoltaic device of the instant invention may be fabricated by incorporating increasing amounts of one or more band gap widening elements into the amorphous semicondonductor alloy material of the intrinsic layer of a p-i-n photovoltaic device as that intrinsic layer is being deposited. Alternatively, band gap narrowing elements, such as germanium, tin, lead, and mixtures thereof, may be employed to narrow the band gap of amorphous semiconductor materials such as silicon and germanium alloys. By utilizing this approach to band gap grading, decreasing amounts of band gap narrowing elements are added to the intrinsic layer of semiconductor material as it is deposited. Note that the patentable merit of the instant invention does not depend upon the manner in which the band gap is graded or upon the manner in which the semiconductor alloy material is deposited. It is only important that a photoresponsive device include therein a graded band gap layer of photoactive material which is specifically adapted to provide substantially uniform absorption of both blue and red light throughout a substantial portion of the bulk thickness of the photoactive material thereof.

In one embodiment of the instant invention, a p-i-n-type photovoltaic device was prepared by glow discharge deposition techniques. A p-doped semiconductor layer of under approximately 200 angstroms thickness was deposited upon a stainless steel substrate by the glow discharge decomposition of a precursor process gas mixture comprising silane, hydrogen, and diborane gas, through the application of radio frequency energy of approximately 13.56 megahertz at a pressure of approximately 0.5 torr. Upon completion of the deposition of the p-doped layer, the deposition chamber was purged and a process gas mixture for depositing a layer of intrinsic amorphous silicon alloy material was admitted thereinto. The precursor intrinsic process gas mixture comprised silane and hydrogen, and the pressure within the deposition chamber was maintained at approximately 0.5 torr. The decomposition of the process gas mixture and the deposition of the intrinsic semiconductor alloy layer was initiated by the application of radio frequency energy and allowed to proceed until approximately 4000 angstroms of intrinsic amorphous silicon alloy material was deposited. At that time, ammonia, equal to 30% of the amount of silane present, was admitted into the deposition chamber and the deposition process proceeded until approximately an additional 1000 angstroms of intrinsic amorphous silicon:nitrogen alloy material was deposited. In this manner, a graded band gap structure comprising approximately 4000 angstroms of an intrinsic amorphous silicon alloy material and 1000 angstroms of amorphous silicon:nitrogen alloy material was deposited. Following the deposition of the graded intrinsic semiconductor layer, a layer of less than approximately 200 angstrom thickness of n-doped amorphous silicon alloy material was deposited atop the intrinsic semiconductor layer by the glow discharge decomposition of a process gas mixture comprising silane, hydrogen, and phosphine precursor gases. In a subsequent processing step, an upper transparent electrode formed of indium tin oxide was deposited atop the layer of n-doped semiconductor alloy material in a reactive evaporation process. The foregoing process resulted in the fabrication of a photovoltaic device which included a layer of intrinsic semiconductor alloy material characterized by a stepped band gap; obviously, a smoothly graded gap could likewise be provided by adding progressively greater amounts of a band gap widening material, such as methane, oxygen, fluorine, or nitrogen to the deposition atmosphere as the intrinsic layer qf semiconductor material is being deposited.

The instant invention is obviously not limited to utilization of layers of the above described thickness. The photovoltaic devices exhibiting the advantages of the instant invention may, for example, be manufactured by utilizing thinner intrinsic regions such as, for example, 3000 angstrom thick intrinsic layers having a graded portion thereatop of about 700 angstroms thickness. Among some of the band gap values having utility in the instant invention are band gaps of from about 1.8 to 2.1 eV for the wide band gap graded portion and band gaps of from 1.5 to 1.8 eV for the narrower band gap portion of the intrinsic layer. It has also been found that tandem cells comprising several stacked p-i-n layers may be fabricated utilizing the principles disclosed herein in one or more of the intrinsic layers thereof. One such device would comprise a dual tandem device having a topmost (i.e., light incident) intrinsic layer which includes a wide band gap portion having a band gap of 1.7 to 2.1 eV and a narrower band gap portion having a band gap of 1.5 to 1.7 eV; disposed immediately thereebeneath is a second p-i-n type cell having an intrinsic layer with a wide band gap portion having a band gap of approximately 1.5 to 1.7 eV and a narrow band gap portion having a band gap of approximately 1.4 to 1.5 eV.

In order to demonstrate the improvement which results by utilizing the principles of the instant invention, a pair of p-i-n-type photovoltaic devices specifically including band gap graded intrinsic layers were fabricated by glow discharge deposition. The devices which were formed on stainless steel substrates comprised an aggregate of layers. Each aggregate of layers included an approximately 100 angstrom thick layer of p-type semiconductor material fabricated by the glow discharge decomposition of a mixture of silane and diborane; and an approximately 100 angstrom thick layer of n-type semiconductor material fabricated by the glow discharge decomposition of silane and phosphine. Disposed between the p and n layers is the graded band gap layer of intrinsic semiconductor material of the instant invention. The graded band gap layer comprises a first approximately 4000 angstrom thick portion formed of an amorphous silicon:hydrogen alloy having a band gap of approximately 1.7 electron volts, which portion is disposed immediately atop the p-layer; and a second approximately 1000 angstrom thick portion formed of an amorphous silicon:hydrogen:nitrogen alloy having a band gap of approximately 1.9 electron volts disposed atop the 1.7 electron volt portion. Deposition of both of the band gap graded intrinsic layer portions was accomplished by a glow discharge process. The 1.7 electron volt portion of the intrinsic layer was deposited by the decomposition of silane, and the 1.9 electron volt portion was deposited by the decomposition of a mixture of 30% $NH_3$ and 70% silane.

For purposes of comparison and control, a similar p-i-n-type photovoltaic device having a 5000 angstrom thick, ungraded intrinsic layer of semiconductor material with a constant 1.7 electron volt band gap was prepared in an identical glow discharge deposition process.

It should be noted that the particular device configuration chosen, i.e., a relatively thick single p-i-n photovoltaic cell, is noted for demonstrating a high degree of photodegradation, which notoriety was borne out by the subsequent performance of the control device. Initial operational parameters, particularly short circuit current under blue illumination (Blue Jsc), were measured, and the devices were then photodegraded by prolonged exposure to AM-1 illumination. Blue Jsc was again measured after 6 and 72 hours of AM-1 illumination.

It was found that significantly less degradation occurred in the Blue Jsc of the test devices incorporating the band gap graded intrinsic layer of the instant invention as compared to the ungraded control device. After 6 hours of photodegradation, the Blue Jsc's of the test devices were 96.0% and 97.1% of the initial values, while the Blue Jsc of the control device was 73% of its original value. After 72 hours of photodegradation, the test devices still exhibited 91.3% and 90.3% of their initial Blue Jsc, while the Blue Jsc of the ungraded control device fell to 54% of its initial value.

While the discussion has heretofore centered solely upon the glow discharge deposition of the graded intrinsic layer, other processes, such as a sputtering process could be similarly employed to fabricate a graded band gap structure for the layer of intrinsic semiconductor material. It is only necessary to (1) add a band gap increasing element to the sputtering atmosphere of the intrinsic semiconductor material as the process progresses to thereby reactively form a sputtered wide band gap intrinsic semiconductor material atop previously deposited narrower band gap intrinsic semiconductor intrinsic semiconductor material, or (2) change sputtering targets during the course of the deposition procedure so as to deposit wider band gap intrinsic semiconductor material. Obviously, similar modifications could be made in an evaporation process or a chemical vapor deposition process to produce the improved graded band gap structure for the layer of intrinsic semiconductor material of the instant invention.

While the foregoing description has dealt primarily with p-i-n type photovoltaic devices, the instant invention is not so limited but may be readily adapted for use in the fabrication of stable photoactive semiconductor material for use in any photoresponsive device in which the recombination of charge carriers at photogenerated defects sites reduces the current generating efficiency of said device. For example, the foregoing analysis and description is equally applicable to n-i-p devices adapted for illumination from the p-doped semiconductor layer side; however, in such devices, the electrons represent the minority charge carriers and are therefore determinative of cell efficiency; accordingly, the previous discussion relative to holes will be applicable to electrons in a n-i-p device. Thus, it must be recognized that the crux of the instant invention is the fabrication of a graded band gap for one or more of the photoactive layers of the semiconductor material of a photoresponsive device so as to promote substantially uniform absorption of red and blue radiation throughout a substantial portion of the bulk thickness of the photoactive region thereof. For example, in a p-n type photovoltaic device the photoactive region, also termed the depletion region, thereof is formed within both the p and the n-doped layers of semiconductor material (proximate the interface therebetween). By appropriately grading the band gap of the p and/or n-doped layers thereof, the light absorption characteristics of the device are modified so as to promote substantially uniform absorption of red and blue light throughout that so-called depletion region. The principles of the instant invention may be similarly applied to yet other photoresponsive devices, such as p-n devices, or Schottky barrier devices, in which a photoactive region is formed in the semiconductor material thereof at the interface thereof with a metallic layer.

The foregoing discussion, explanation, graphs and drawings are meant to illustrate the principles and practice of the instant invention and are not intended as a limitation upon the practice thereof. The scope of the instant invention is defined solely by the following claims, read in light of the specification, and including all equivalents thereof.

What is claimed is:

1. A photovohaic device of the type comprising a semiconductor body having a first electrode in electrical communication with a first surface thereof, said first electrode forming the light incident surface of the device, and a second electrode in electrical communication with a second surface thereof, said semiconductor body comprising:

at least one triad of semiconductor layers including a layer of substantially intrinsic semiconductor material, a layer of p-type semiconductor material disposed in contact with a first surface of the intrinsic layer, and a layer of n-type semiconductor material disposed in contact with a second surface of the intrinsic layer, said layers cooperating to provide a photoactive region for absorbing photons of incident light and generating charge carrier pairs in response thereto;

the intrinsic layer of at least one of said triads including a wide band gap portion disposed proximate the light incident surface of the device, said wide gap portion (a) being less than one half the thickness of the remaining narrower gap portion of the intrinsic layer and (b) including at least one band gap broadening material not present in the narrower gap portion, whereby substantially uniform absorption of photons throughout at least a substantial portion of the bulk of the photoactive region is promoted, so as to generate electron hole pairs through said substantial portion and reduce charge carrier recombination therein, for providing a photovoltaic device exhibiting long term stability.

2. A photovoltaic device as in claim 1, wherein the intrinsic layer comprises an amorphous silicon alloy material and the band gap broadening material is chosen from the group consisting essentially of: nitrogen, oxygen, carbon, fluorine, and mixtures thereof.

3. A photovoltaic device as in claim 1, wherein the intrinsic layer is at least 3000 angstroms thick, and the wide band gap portion thereof is at least 700 angstroms thick.

4. A photovoltaic device as in claim 1, wherein the wide gap portion of the intrinsic layer has a band gap of approximately 1.8 to 2.1 electron volts and the narrower gap portion thereof has a band gap of approximately 1.5 to 1.8 electron volts.

5. A photovoltaic device as in claim 1, including two triads of semiconductor layers, the intrinsic layer of each triad having a wide gap portion.

6. A photovoltaic device as in claim 5, wherein the first triad is most proximate the first electrode of the photovoltaic device, and the wide gap portion of the intrinsic layer of the first triad has a band gap of approximately 1.7 to 2.1 electron volts and the narrow gap portion thereof has a band gap of approximately 1.5 to 1.7 electron volts; and, the second triad is distal of the first electrode of the photovoltaic device and the wide gap portion of the second triad has a band gap of approximately 1.5 to 1.7 electron volts and the narrow gap portion thereof has a band gap of approximately 1.4 to 1.5 electron volts.

7. A photovoltaic device as in claim 1, wherein the band gap of said wide gap portion is graded, the widest gap region thereof disposed proximate the light incident surface of the device and the narrowest gap region thereof disposed proximate said narrower gap portion.

8. A method of fabricating a photovoltaic device of the type comprising a semiconductor body having a first electrode in electrical communication with a first surface thereof, said first electrode forming the light incident surface of the device and a second electrode in electrical communication with a second surface thereof, said semiconductor body comprising at least one triad of semiconductor layers including a layer of substantially intrinsic semiconductor material, a layer of p-type semiconductor material disposed in contact with a first surface of the intrinsic layer and a layer of n-type semiconductor material disposed in contact with a second surface of the intrinsic layer, the method comprising the step of:

providing an intrinsic layer in at least one of said triads having a wide band gap portion disposed proximate the light incident surface of the device, said wide gap portion (a) being less than one-half the thickness of the remaining narrower gap portion of the intrinsic layer and (b) including at least one band gap broadening material not present in the narrower gap portion.

9. A method as in claim 8, wherein the step of providing an intrinsic layer having a wide gap portion comprises providing an amorphous silicon alloy material.

10. A method as in claim 9, including the further step of providing said wide gap portion with a band gap broadening material chosen from the group consisting essentially of nitrogen, oxygen, carbon, fluorine, and mixtures thereof.

* * * * *

UNITED STATES PATENT AND TRADEMARK OFFICE
CERTIFICATE OF CORRECTION

PATENT NO. : 4,547,621

DATED : Oct. 15, 1985

INVENTOR(S) : Michael Hack, Troy; Subhendu Guha, Clawson, both of Michigan

It is certified that error appears in the above—identified patent and that said Letters Patent is hereby corrected as shown below:

Column 2, line 61, "continuous" should read --Continuous--;
Column 3, line 43, delete "degrees";
Column 6, line 18, insert --are-- after "photons";
Column 10, line 58, insert --the-- after "of";
Column 12, line 10 "arangements" should read --arrangements--;
Column 16, line 37, "semicondonductor" should read --semiconductor--;
Column 17, line 36, "qf" should read --of-- ;
Column 18, line 63, delete "intrinsic semiconductor";
Column 20, line 17, "narrower" should read --narrow--.

Signed and Sealed this

Fourteenth Day of January 1986

[SEAL]

Attest:

DONALD J. QUIGG

Attesting Officer

Commissioner of Patents and Trademarks